US008187772B2

(12) United States Patent
Goruganthu et al.

(10) Patent No.: US 8,187,772 B2
(45) Date of Patent: May 29, 2012

(54) SOLID IMMERSION LENS LITHOGRAPHY

(75) Inventors: Rama R. Goruganthu, Austin, TX (US); Michael R. Bruce, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1744 days.

(21) Appl. No.: 10/961,347

(22) Filed: Oct. 8, 2004

(65) Prior Publication Data

US 2006/0078637 A1    Apr. 13, 2006

(51) Int. Cl.
G03F 1/00 (2012.01)
G02B 13/18 (2006.01)

(52) U.S. Cl. .......................................... 430/5; 359/719

(58) Field of Classification Search ... 430/5; 716/19–21
See application file for complete search history.

(56) References Cited

U.S. PATENT DOCUMENTS

| | | | |
|---|---|---|---|
| 5,121,256 A | 6/1992 | Corle et al. | 359/664 |
| 5,517,279 A * | 5/1996 | Hugle et al. | 355/46 |
| 5,517,280 A | 5/1996 | Quate | |
| 5,939,709 A * | 8/1999 | Ghislain et al. | 250/216 |
| 6,301,055 B1 * | 10/2001 | Legrand et al. | 359/642 |
| 6,335,522 B1 | 1/2002 | Shimada et al. | 250/201.3 |
| 6,441,359 B1 * | 8/2002 | Cozier et al. | 250/216 |
| 6,507,439 B1 * | 1/2003 | Wester | 359/619 |
| 6,683,723 B2 * | 1/2004 | Frosig et al. | 359/626 |
| 6,687,058 B1 | 2/2004 | Ippolito et al. | 359/656 |
| 6,809,886 B2 * | 10/2004 | Hsu et al. | 359/719 |
| 6,831,782 B2 * | 12/2004 | Patton et al. | 359/396 |
| 6,893,958 B2 * | 5/2005 | Coursey et al. | 438/637 |
| 7,083,902 B2 * | 8/2006 | Hsu et al. | 430/321 |
| 2003/0123155 A1 * | 7/2003 | Quake et al. | 359/664 |
| 2003/0231400 A1 | 12/2003 | Frosig et al. | 359/619 |
| 2004/0085644 A1 | 5/2004 | Patton | |
| 2005/0007567 A1 * | 1/2005 | Pierrat et al. | 355/18 |

FOREIGN PATENT DOCUMENTS

| | | |
|---|---|---|
| WO | WO 00/23840 A1 | 4/2000 |
| WO | WO 02/37537 A2 | 5/2002 |

OTHER PUBLICATIONS

S. B. Ippolito et al.; High Spatial Resolution Subsurface Microscopy; *Applied Physics Letters*; vol. 78, No. 26; Jun. 25, 2001; pp. all.

D. A. Fletcher et al.; Near-field Infrared Imaging with a Microfabricated Solid Immersion Lens; *Applied Physics Letters*; vol. 77, No. 14; Oct. 2, 2000; pp. all.

Qiang Wu et al.; Realization of Numerical Aperture 2.0 Using a Gallium Phosphide Solid Immersion Lens; *Applied Physics Letters*; vol. 75, No. 26; Dec. 27, 1999; pp. all.

(Continued)

*Primary Examiner* — Mark F Huff
*Assistant Examiner* — Jonathan Jelsma
(74) *Attorney, Agent, or Firm* — Ditthavong, Mori & Steiner, P.C.

(57) ABSTRACT

Lithography using solid immersion lenses is disclosed. In one aspect, an apparatus is provided that includes a resist film that has a first side and a second and opposite side. One or more solid immersion lenses are positioned over the first side of the resist film. In another aspect, a method of manufacturing is provided that includes forming a resist film and exposing the resist film with radiation transmitted through one or more solid immersion lenses.

18 Claims, 8 Drawing Sheets

OTHER PUBLICATIONS

Mesut Eraslan et al.; High spatial resolution subsurface microscopy; http://stigma.bu.edu/projects.asp?project=solidimmersion; Jul. 11, 2004.

Timothy R. Coyle et al.; *Confocal Scanning Optical Microscopy*; 1996; pp. 3, 120, 133 and 212.

Harry J. Levinson; *Principles of Lithography*, 2001; pp. 133-174.

\* cited by examiner

SOLID IMMERSION LENS LITHOGRAPHY

BACKGROUND OF THE INVENTION

1. Field of the Invention

This invention relates generally to semiconductor processing, and more particularly to methods and apparatus for lithographic patterning of structures.

2. Description of the Related Art

The fabrication of modern integrated circuits requires the patterning of millions of different types of regions on a semiconductor wafer, such as local interconnect trenches, global metallization layers, and transistor gates, to name just a few. The manufacture of such multitudes of tiny structures is made possible by the use of lithographic processing. In photolithographic processing, a layer of photoresist material is applied to the wafer, frequently by spin-coating. Next, the photoresist layer is exposed to an actinic radiation source, such as deep ultraviolet ("DUV"). The DUV radiation is first passed through a mask or reticle that selectively transmits some of the DUV radiation while blocking other portions so that only preselected portions of the photoresist are exposed to the radiation. The radiation transmitted through the reticle then passes through one or more reduction lenses before striking the resist layer. The radiation changes the chemical character of the photoresist, either rendering it soluble or insoluble in a subsequent solvent step, depending upon whether the resist is negative-tone or positive-tone photoresist. The resist is then developed by exposure to a developer solvent. The areas of the photoresist remaining after the development step mask and protect the substrate regions that they cover.

The quality as well as the minimum feature size of the developed image depends on, among other things, the wavelength of the exposure radiation, the focusing capabilities of the reduction lens(es), and the optical properties of the resist and the films underlying the resist. The wavelength of the exposure radiation has historically been somewhat constrained by the requirement that illumination sources produce radiation at a relatively high intensity over a relatively narrow bandwidth. More capable reduction lenses have helped to push imaging to the diffraction limit. However, there are still physical limits to the improvement of reduction lenses.

Various authors have described the use of a solid immersion lens to image microcircuit structures. In one variant of the concept, a single solid immersion lense with a relatively high refractive index is positioned between an objective lens and the structure to be imaged. With the solid immersion lens in place, light transmitted from the objective lens is focused in the solid immersion lens instead of air or some other medium. This produces an attendant increase in the effective numerical aperture of the imaging system due to lowered effective wavelength, since the light is focused in the solid immersion lens where the refractive index is relatively high. Another conventional imaging system uses an array of solid immersion lenses to image Raman scattering from a device undergoing inspection. Whether in single or array format, known conventional solid immersion lenses have been described in the context of imaging but not lithography.

The present invention is directed to overcoming or reducing the effects of one or more of the foregoing disadvantages.

SUMMARY OF THE INVENTION

In accordance with one aspect of the present invention, an apparatus is provided that includes a resist film that has a first side and a second and opposite side. One or more solid immersion lenses are positioned over the first side of the resist film.

In accordance with another aspect of the present invention, a apparatus is provided that includes an exposure mask, a source of radiation to illuminate the exposure mask, one or more solid immersion lenses positioned beneath the exposure mask to focus radiation transmitted through the exposure mask, and a member for holding the one or more of solid immersion lenses.

In accordance with another aspect of the present invention, an apparatus is provided that includes a circuit device, a resist film positioned on the circuit device, an exposure mask positioned above the resist film and a source of radiation to illuminate the exposure mask. One or more solid immersion lenses are positioned between the exposure mask and the resist film to focus radiation transmitted through the exposure mask in the resist film. A member is provided for holding the one or more of solid immersion lenses.

In accordance with another aspect of the present invention, an apparatus is provided that includes a circuit device, a resist film positioned on the circuit device, an exposure mask positioned above the resist film, and a source of radiation to illuminate the exposure mask. An array of solid immersion lenses is coupled to the resist film to focus radiation transmitted through the exposure mask in the resist film. A member is provided for holding the circuit device.

In accordance with another aspect of the present invention, a method of manufacturing is provided that includes forming a resist film and exposing the resist film with radiation transmitted through one or more solid immersion lenses.

In accordance with another aspect of the present invention, a method of manufacturing is provided that includes forming a resist film and forming one or more solid immersion lenses on the resist film.

In accordance with another aspect of the present invention, a mask is provided that includes a plate capable of transmitting electromagnetic radiation. The plate includes at least one solid immersion lens. An opaque film is positioned on the plate. The opaque film is operable to allow transmission of the electromagnetic radiation through the at least one solid immersion lens but prevent transmission of the electromagnetic radiation through at least a portion of the plate.

In accordance with another aspect of the present invention, an apparatus is provided that includes a source of electromagnetic radiation and mask for passing selected portions of the electromagnetic radiation. The mask includes a plate capable of transmitting electromagnetic radiation. The plate includes at least one solid immersion lens and an opaque film on the plate. The opaque film is operable to allow transmission of the electromagnetic radiation through the at least one solid immersion lens but prevent transmission of the electromagnetic radiation through at least a portion of the plate.

In accordance with another aspect of the present invention, an apparatus is provided that includes a circuit device, a resist film positioned on the circuit device, a source of electromagnetic radiation, and a mask positioned between the source of electromagnetic radiation and the resist film for passing selected portions of the electromagnetic radiation to the resist film. The mask includes a plate capable of transmitting electromagnetic radiation. The plate includes at least one solid immersion lens and an opaque film on the plate. The opaque film is operable to allow transmission of the electromagnetic radiation through the at least one solid immersion lens but prevent transmission of the electromagnetic radiation through at least a portion of the plate.

In accordance with another aspect of the present invention, a method of manufacturing is provided that includes forming a resist film and exposing the resist film with radiation transmitted through a mask including a plate capable of transmitting electromagnetic radiation. The plate includes at least one solid immersion lens and an opaque film on the plate. Te opaque film is operable to allow transmission of the electromagnetic radiation through the at least one solid immersion lens but prevent transmission of the electromagnetic radiation through at least a portion of the plate.

A method of manufacturing is provided that includes forming at least one solid immersion lense on a plate capable of transmitting electromagnetic radiation, and forming an opaque film on the plate. The opaque film is operable to allow transmission of the electromagnetic radiation through the at least one solid immersion lens but prevent transmission of the electromagnetic radiation through at least a portion of the plate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
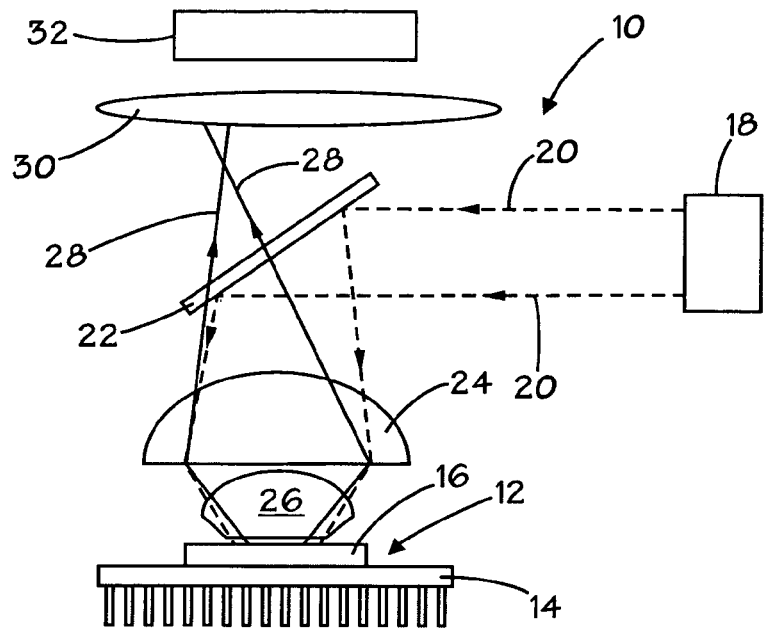
FIG. 1 is a side schematic view of an exemplary conventional solid immersion lens ("SIL") microscope.

In the drawings described below, reference numerals are generally repeated where identical elements appear in more than one figure. Turning now to the drawings, and in particular to FIG. 1, therein is shown a side schematic view of an exemplary conventional solid immersion lens ("SIL") microscope 10 that is used to image an integrated circuit 12. The integrated circuit 12 consists of a package 14 and an integrated circuit chip 16. The microscope 10 includes an illumination source 18 operable to deliver incident radiation 20 to a reflecting mirror or beam splitter 22. The incident rays 20 pass through an objective lens 24 and an underlying solid immersion lens 26. The solid immersion lens 26 focuses the incoming radiation 20 at a particular location or field of view on the chip 16. Reflected radiation 28 transmits back up through the solid immersion lens 26, the objective lens 24 and the beam splitter 22 where it is delivered to either an eye piece 30 or a camera 32 or both. In this conventional system, the solid immersion lens 26 is typically held directly on the upper surface of the integrated circuit chip 16 during imaging. Relative movement is established between the SIL 26 and the underlying chip 16 for scanning across the chip 16.

Figure 2:
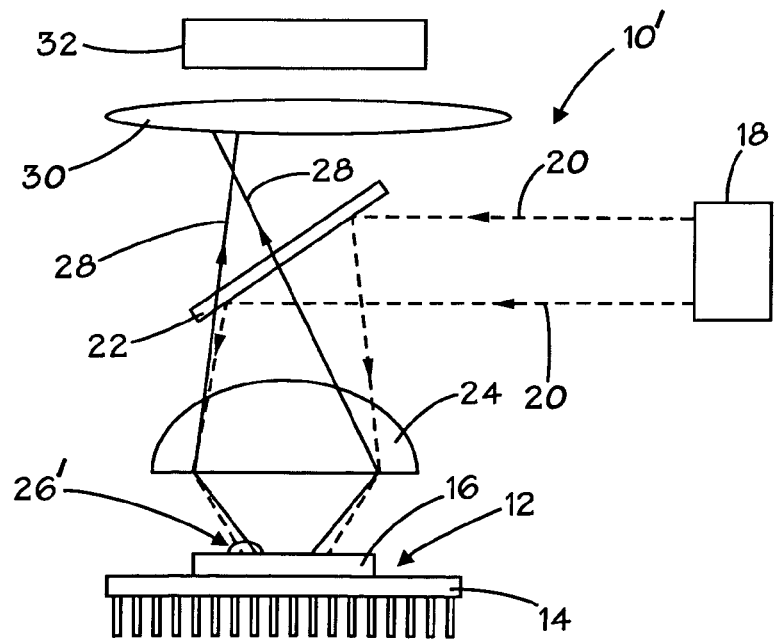
FIG. 2 is aside schematic view of another exemplary conventional SIL microscope.

Another conventional SIL microscope system 10' operable to image an integrated circuit 12 consisting of a chip 16 and a package 14 is depicted in FIG. 2. Like the system depicted in FIG. 1, the conventional SIL microscope 10' includes the illumination source 18 for propagating incident radiation, a mirror 22, an objective 24, and an eyepiece 30 or camera 32 to receive reflected radiation 28. However, the solid immersion lens 26' is itself positioned directly on the integrated circuit chip 16. The lens 26' is typically removed after the integrated circuit chip 16 has been imaged.

Figure 3:
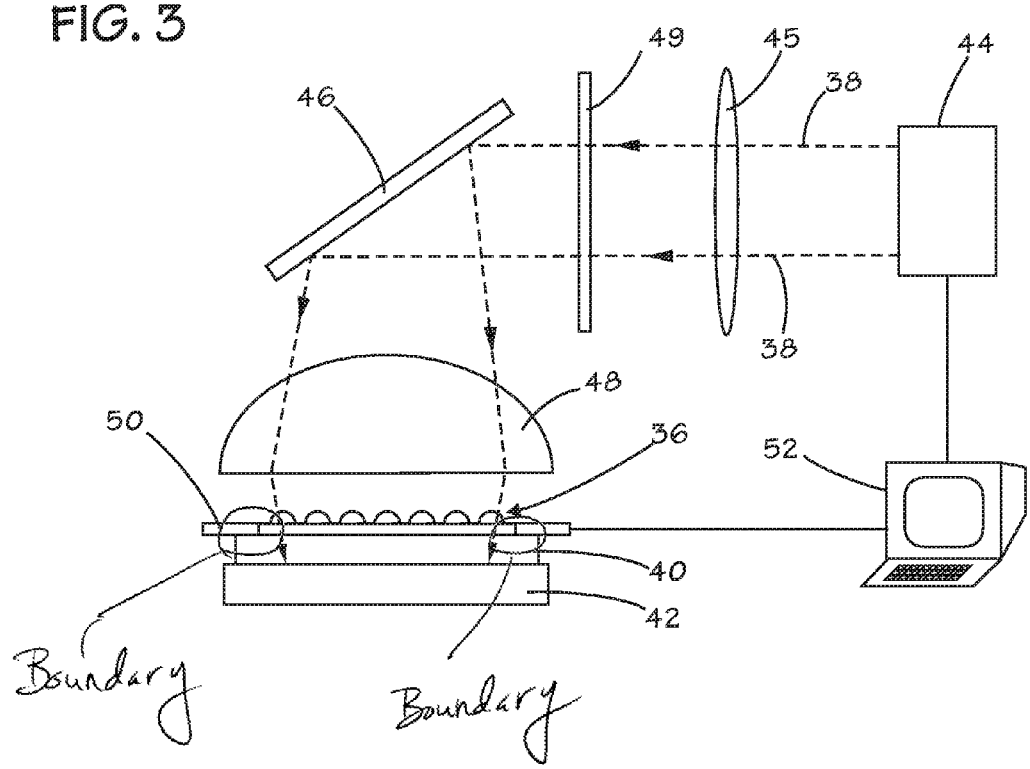
FIG. 3 is a side schematic view of an exemplary embodiment of a lithography system that utilizes a solid immersion lens array in accordance with the present invention.

FIG. 3 is a side schematic view of an exemplary embodiment of a lithography system 34 in accordance with the present invention that utilizes a solid immersion lens array 36 for focusing incident radiation 38 into selected portions of a resist film 40. The resist film 40 is formed on a circuit device 42. The circuit device 42 may be an integrated circuit or other type of circuit device at any stage of manufacture. For example, the circuit device 42 may be an integrated circuit implemented in either bulk semiconductor, such as silicon, or in a semiconductor-on-insulator substrate. The system 34 includes an illumination source 44 that may produce either coherent or incoherent radiation. A collimating lens 45 may be placed at the optical output of the source 44. A mirror 46 may be provided to control the pathway of the incident radiation 38. An objective lens 48 is positioned above the SIL array 36. An exposure mask or reticle 49 is positioned at the output side of the collimating lens 45 and in the path of the radiation 38. The SIL array 36 is held by a movable stage 50 that is operable to provide relative lateral movement between the SIL array 36 and the underlying resist film 40. Optionally, the relative motion may be provided by moving the integrated circuit 42 instead of or in addition to moving the overlying SIL array 36. The movement of the stage 50 as well as the illumination source 44 may be controlled by a controller 52, which may be a computer, microprocessor or other control system.

Figure 4:
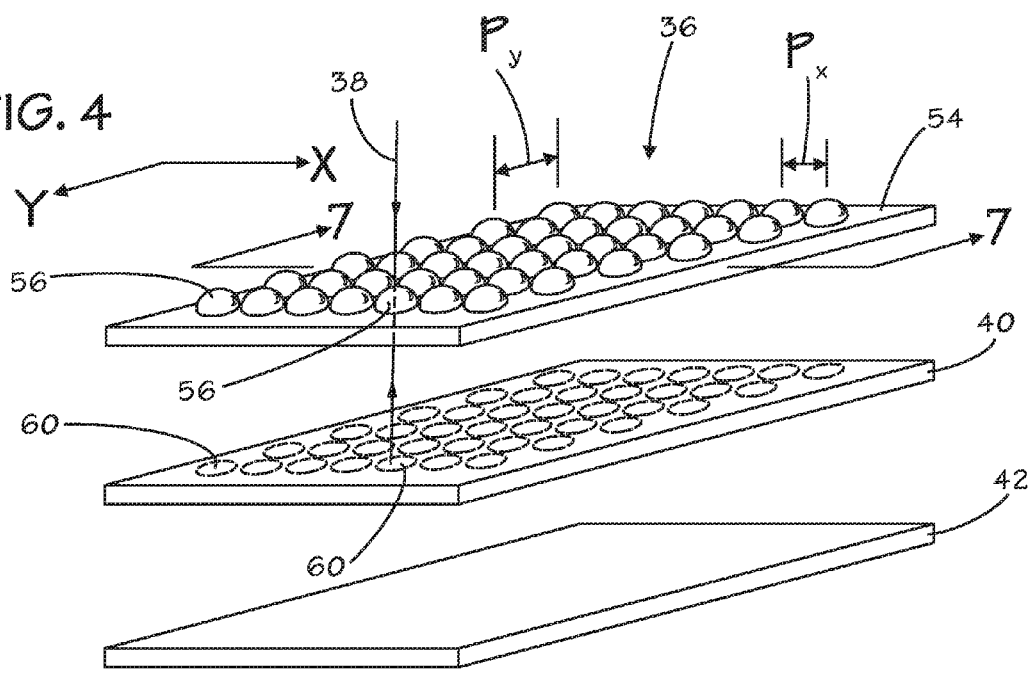
FIG. 4 is an exploded pictorial view of a portion of FIG. 3 in accordance with the present invention.

Additional detail regarding the SIL array 36 may be understood by referring now to FIG. 4, which is an exploded pictorial view of the SIL array 36, the resist film 40 and the integrated circuit 42. The SIL array 36 consists of a base substrate 54 upon which a plurality of SILS 56 are formed. The material from which the substrate 54 and the lenses 56 are fabricated preferably has a refractive index n that is substantially the same as the underlying resist film 40 so that adverse issues associated with reflection between interfaces may be reduced or eliminated. The dimensions of the substrate 54 are largely a matter of design discretion. In an exemplary embodiment, the substrate 54 may have a length and width of about 18 mm×18 mm respectively, and a thickness of about $5 \times 10^5$ to $6 \times 10^5$ nm.

The lenses 56 may have a spherical, or something less or something greater than a truly spherical configuration. Indeed, the exact geometry of the individual lenses 56 may be varied greatly depending upon the optical requirements of the resist film 46. In an exemplary embodiment, the lenses have a hemispherical surface with a radius of about $2 \times 10^5$ to $3 \times 10^5$ nm. The lenses 56 are formed in an array, the geometry of which is largely a matter of design discretion. In this regard, the lenses 56 may be spaced in the "Y" direction by a pitch $P_y$, and in the "X" direction by a pitch $P_x$. The respective pitches $P_y$ and $P_x$ may or may not be equal. While plural lenses 56 are depicted, it is anticipated that one or more lenses 56 may be used.

Each of the lenses 56 will exhibit a field of view 60 on the underlying resist film 40. The dimensions of the fields of view 60 will depend on the geometry of the lenses 56, their composition, as well as other factors, such as the spacing between the arrays 36 and the resist film 40 and the wave length of the incident radiation 38.

Figure 5:
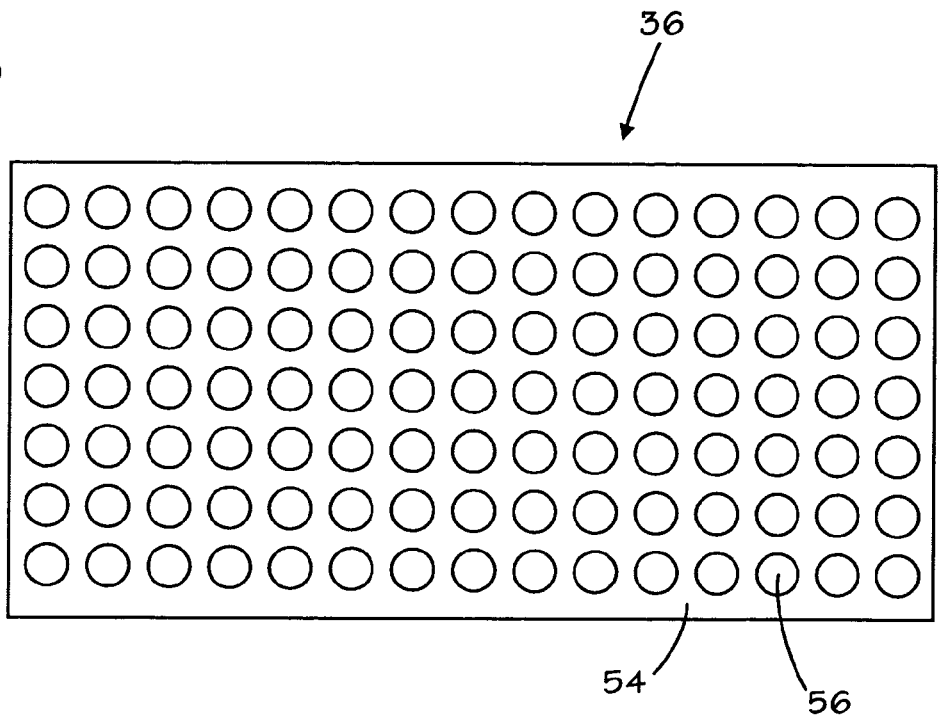
FIG. 5 is a plan view of an exemplary solid immersion lens array in accordance with the present invention.
Figure 6:
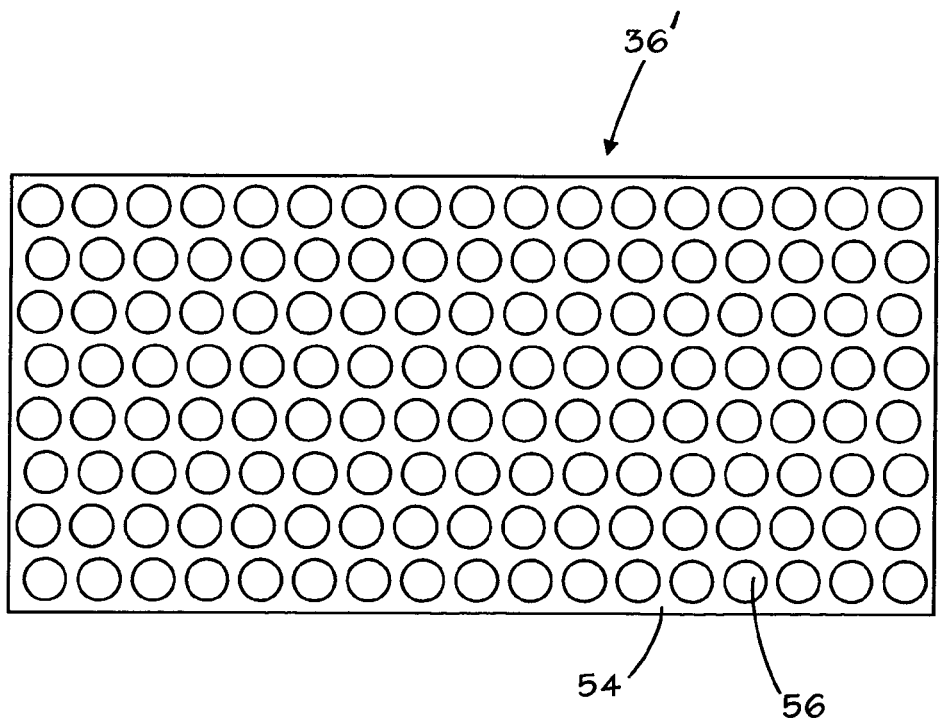
FIG. 6 is a plan view of another exemplary solid immersion lens array in accordance with the present invention.

As noted above, the SIL array 36 may have a variety of geometries. FIGS. 5 and 6 depict plan views of two possible array configurations. FIG. 5 discloses an array 36 in which the lenses 56 are arranged on the substrate 54 in a rectangular array. FIG. 6 depicts an alternative in which the array 36' has the lenses 56 arranged on the substrate 54 in a hexagonal pattern. These two embodiments represent just two of the myriad of possible arrangements of the lenses 56 on the substrate 54. Indeed, it is envisioned that the lens device or array 36 need not provide for the lenses 56 in an array at all. In this regard, a plurality of lenses 56 may be positioned at particular locations on the substrate 54 though not necessarily in a geometric array of some sort.

Figure 7:
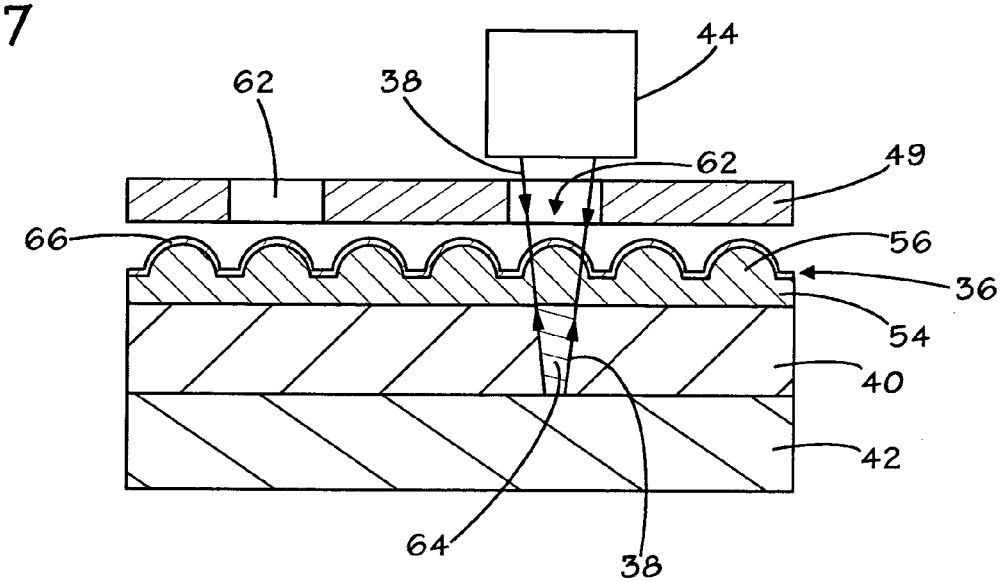
FIG. 7 is a cross-sectional view of a portion of FIG. 3 taken at section 7-7 in accordance with the present invention.

Attention is now turned to FIG. 7, which is a cross-sectional view of FIG. 4 taken at section 7-7 but without the array 36 being exploded from the resist film 40 or the underlying integrated circuit 42. For simplicity of illustration, the illumination source 44 is depicted but the controller 52, the mirror 46 and the objective lens 48 are not depicted. As noted above in the discussion of FIG. 3, the lens device 36 is preferably placed as close as possible to the upper surface of the resist film 40. The precise spacing is largely a matter of design discretion. It is anticipated that good results will be obtained if the spacing is perhaps on the order of $\lambda/10$, where $\lambda$ is the wavelength of the exposure radiation 38. With the reticle 49 in place, incident radiation 38 emitted from the illumination source 44 passes through one or more openings 62 in the reticle 49. The incident radiation 38 is then focused by one or more of the lenses 56 of the lens device 36 to produce a plurality of exposed regions 64 in the resist film 40, only one of which is shown. If desired, a top anti-reflective coating 66 may be formed on the upper surface of the lenses 56 of the lens device 36. Following the first exposure, the lens device 36 may be translated in either the "X" or "Y" direction (see FIG. 4) relative to the underlying resist film 40 and a second exposure or even a third or fourth exposure if desired may be performed in order to adequately expose all the regions of interest in the resist film.

As noted above, the lens device 36 is preferably fabricated with substantially the same refractive index as the underlying resist film 40. Exemplary materials include, for example, silicon, germanium, cyano-acrylic films, polycarbonate films, poly-methyl-acrylate, various glasses, oxides of silicon, silicon nitride or the like. It is desirable for the substrate 54 to exhibit thermal stability in the temperature range of about 0 to 150° C. The lenses 56 may be fabricated by subjecting the substrate 54 to well-known Bosch etching techniques, ion beam milling, or other lithographic techniques. Embossing is also envisioned as a technique for manufacturing the lenses 56.

The top anti-reflective coating 49 may be fabricated from a variety of materials suitable for such films, such as, for example, magnesium fluoride, lead fluoride, silicon monoxide or the like. The top anti-reflective coating 49 may have a thickness that is on the order of $\lambda/4$. The reticle 49 may be a conventional type reticle or, alternatively, a phase shifting mask, if desired.

Figure 8:
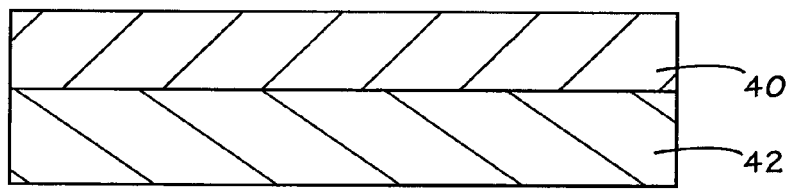
FIG. 8 is a cross-sectional view of an exemplary resist film positioned on an underlying integrated circuit in accordance with the present invention.

In an alternate exemplary embodiment in accordance with the present invention, the lens device 36 may be formed directly on the underlying resist film. Attention is now turned to FIG. 8, which is a cross-sectional view of the resist film 40 positioned on the underlying integrated circuit 42. The resist film 40 may be fabricated using well-known materials and techniques for resist coating, and baking. Positive-tone or negative-tone resists with actinic sensitivity to a variety of exposure wavelengths may be used. Spin coating or other well-known application techniques may be used. If desired, a solvent pre-wet process may be performed just prior to application of the resist film 40 in order to overcome the surface energy of the primed surface of the film 40. A variety of well-known solvent pre-wet solvents may be used. For example, a mixture of ethyl-lactate and 4-methyl-2-pentanone may be dispensed on the primed film 40 and spun off at a high spin speed, such as at about 5,000 to 10,000 rpm. As the pre-wet solvents are evaporating from the film circuit device 42, the resist film 40 is applied using the aforementioned techniques. Following resist coating, one or more bake processes are performed. In an exemplary embodiment, the resist 40 is heated to about 90 to 110° C. for about 45 to 300 seconds at atmospheric pressure.

Figure 9:
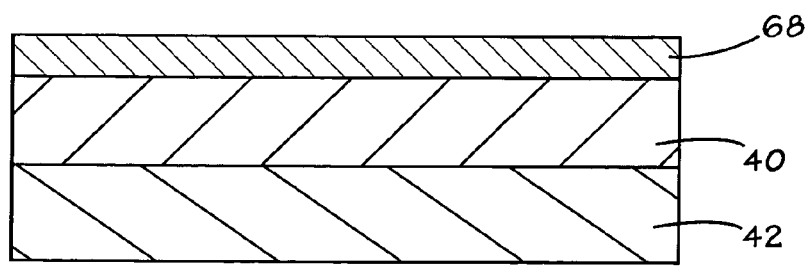
FIG. 9 is a cross-sectional view like FIG. 8 depicting formation of a film on the resist film in accordance with the present invention.

Referring now to FIG. 9, a film 68 is applied to the resist film 40. Through subsequent processing, the film 68 will be transformed into the lens device as described more fully below. As with the other disclosed embodiment, the film 68 from which the lens device will ultimately be fabricated may be formed from a variety of materials that have a refractive index that closely approximates the refractive index of the underlying resist film 40. For example, the film 68 may be fabricated from the same type of resist material as the underlying resist film 40, albeit, without any photo active compounds incorporated therein.

Figure 10:
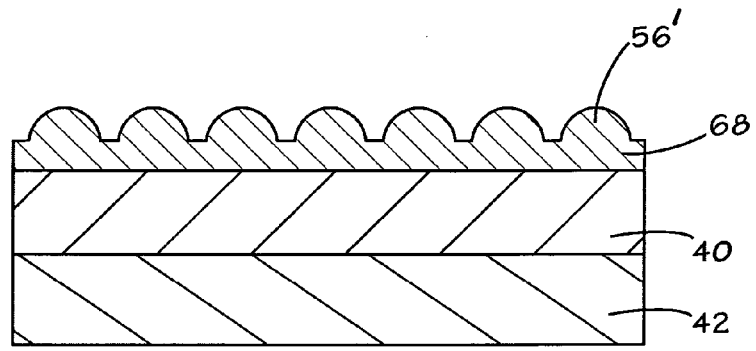
FIG. 10 is cross-sectional view like FIG. 9 depicting the patterning of an array of solid immersion lenses on the film in accordance with the present invention.

Referring now to FIG. 10, the film 68 is processed to form the lenses 56'. The lenses 56' may be formed by embossing the film 68 or other well-known lithography techniques, such as ion beam milling, laser ablation, etching or the like. With the lenses 56' formed, the top anti-reflective coating 66 depicted in FIG. 7 may be applied if desired and then the exposure process as depicted in FIG. 7 and described elsewhere herein may be performed. Following the exposure, both the lens device 36' and the underlying resist film 40 may be removed by well-known ashing, solvent stripping or combinations of the two, or the like. The removal process for the lens device 36' will, of course, depend on the particular materials selected for its manufacture.

Figure 11:
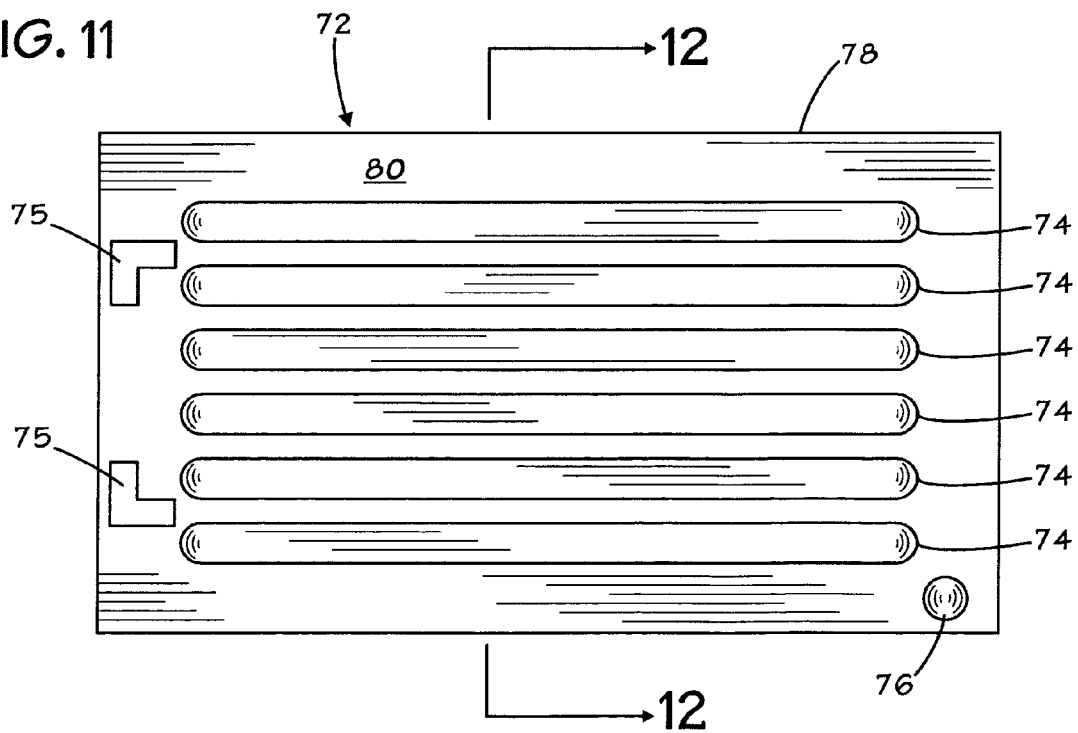
FIG. 11 is a plan view of an exemplary embodiment of a lithography mask incorporating one or more solid immersion lenses in accordance with the present invention.
Figure 12:
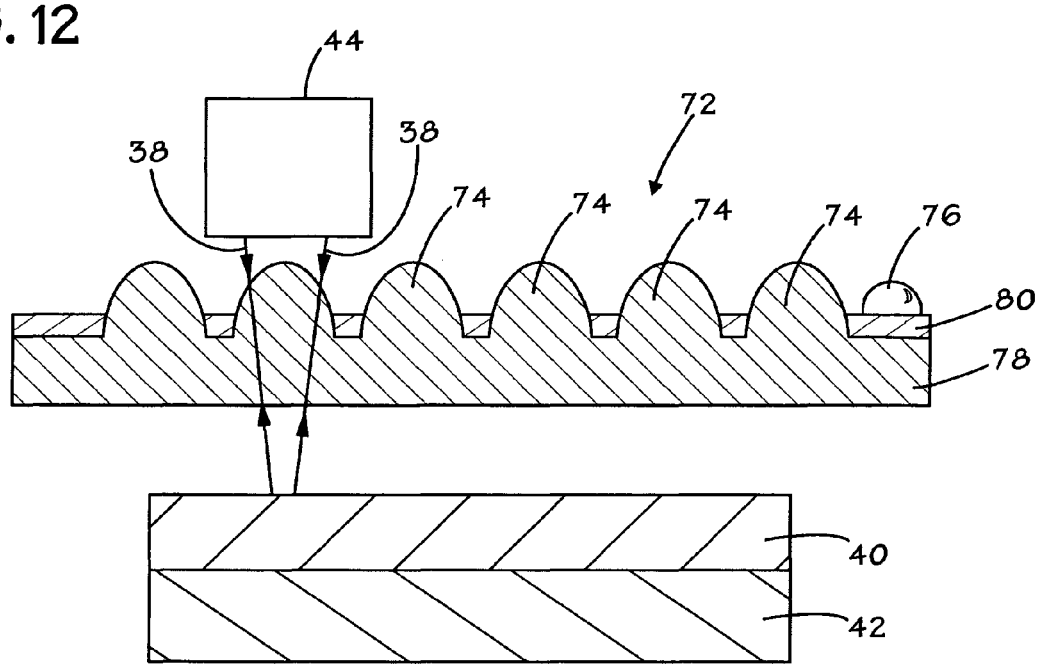
FIG. 12 is a cross-sectional view of FIG. 11 taken at section 12-12 in accordance with the present invention.

Another exemplary embodiment in accordance with the present invention may be understood by referring now to FIGS. 11 and 12. This exemplary embodiment combines one more solid immersion lenses with a lithography mask. FIG. 11 depicts a plan view of a lithography mask 72 that incorporates one or more solid immersion lenses 74, 75 and 76 positioned on a plate or substrate 78. The plate 78 may be fabricated from the types of materials described elsewhere herein. Other possible materials include soda-lime glass, borosilicate glass, quartz or the like. At least a portion of the plate 78 is covered by an opaque film 80 such that incident electromagnetic radiation may pass through the one or more lenses 74, 75 and 76 but not the opaque film 80. The opaque film 80 may be fabricated from a variety of materials, such as, for example, emulsion, chrome, iron oxide or the like.

The solid immersion lenses 74, 75 and 76 may have a myriad of shapes, but preferably are shaped according whatever patterns are intended to be printed in a circuit device. In most cases, the shapes of the lenses 74, 75 and 76 will correspond to the desired shapes of transistor structures, interconnect lines and other structures to be patterned in an integrated circuit. Thus, while the lenses 74 are depicted as elongate structures suitable for patterning, say, conductor lines in an integrated and circuit, the lenses 75 are depicted as elbow shapes and the lens 76 is depicted as spherical, virtually any shape may be used.

Attention is now turned to FIG. 12, which is a cross-sectional view of FIG. 11 taken at section 12-12. In addition to depicting the mask 72, FIG. 12 also shows the electromagnetic radiation source 44, a circuit device 42 and a resist film 40 as described elsewhere herein. Other optical elements of the types depicted in FIG. 3, such as a mirror and collimating lens, are omitted from FIG. 12 for simplicity of illustration. The mask 72 is positioned between the radiation source 44 and the resist film 40. The solid immersion lenses 74 and 76 transmit and focus radiation 38 from the source 44 as a selected pattern in the resist film 40, with shape of the exposure being determined by the shapes of the lenses 74 and 76 and the extent of the opaque film 80. If desired, multiple exposures may be performed with the mask 72 translated relative to the resist film 40 between successive exposures in order to obtain a desired spacing between exposed regions in the resist 40. Optionally, another mask (not shown) may be used for a follow up exposure(s) that may or may not incorporate a solid immersion lens. Following exposure, the resist 40 may be developed using well-known techniques for resist development.

Figure 13:
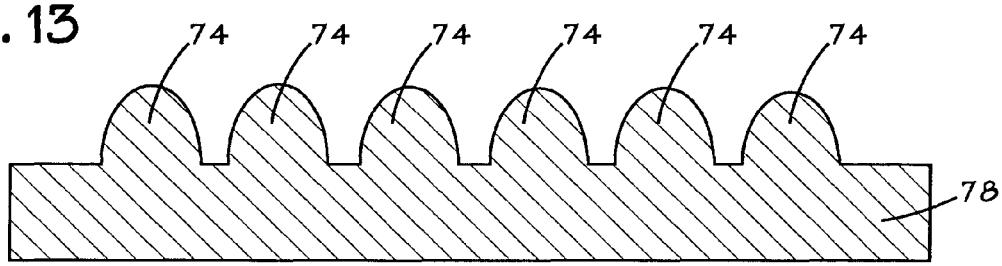
FIG. 13 is a cross-sectional view depicting initial formation of one or more solid immersion lenses on a plate in accordance with the present invention.
Figure 14:
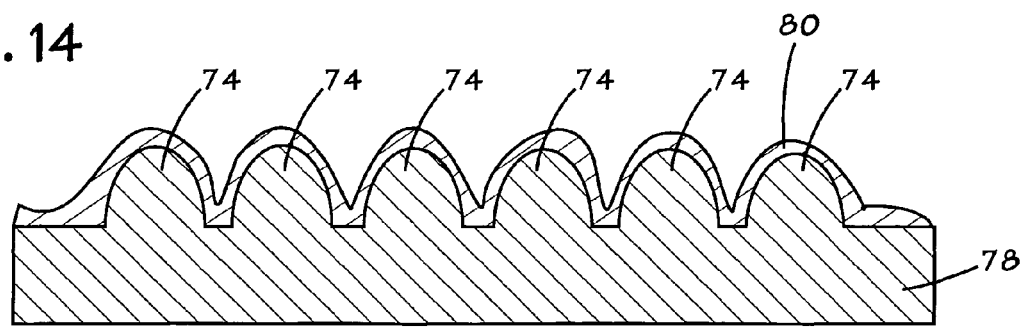
FIG. 14 is a cross-sectional view like FIG. 13 depicting formation of an opaque film on the solid immersion lenses in accordance with the present invention.
Figure 15:
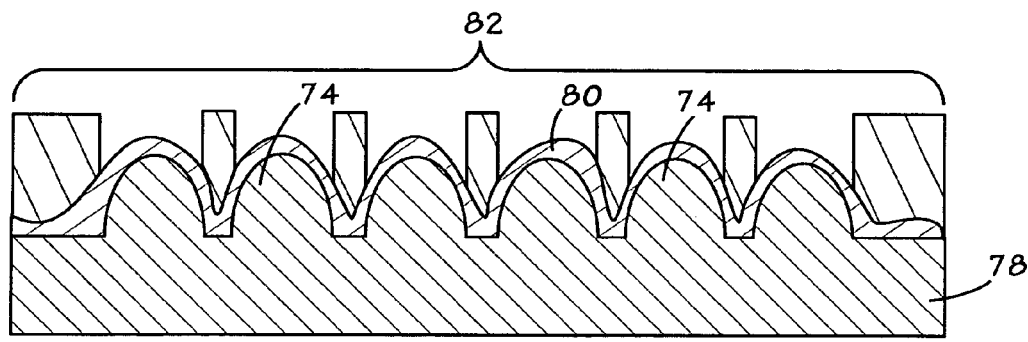
FIG. 15 is a cross-sectional view like FIG. 14 depicting formation of a material removal mask on the opaque film in accordance with the present invention.

An exemplary method in accordance with the present invention for fabricating the mask 72 may be understood by referring now to FIGS. 13, 14 and 15. FIG. 13 is a cross-sectional view depicting the mask 72 following definition of one or more solid immersion lenses 74 on the plate 78. The fabrication of the lenses 74 may be done using a variety of well-known patterning techniques, such as, for example, ion beam milling, directional or non-directional etching, embossing or the like. In an exemplary embodiment, the plate 78 may be appropriately masked and etched to define the solid immersion lenses 74. Next, and as depicted in FIG. 14, the opaque film 80 of the type described above may be formed over the lenses 74 and other portions of the plate 78 as desired. The deposition or formation of the opaque film 80 may be by sputter deposition, chemical vapor deposition or other well-known film deposition techniques. Following the formation of the opaque film 80 and as shown in FIG. 15, another mask 82 is patterned on the opaque film 80 such that areas of the opaque film 80 overlying the solid immersion lenses 74 will be exposed. Next, unmasked portions of the opaque film 80 removed wet etching, dry etching, e-beam etching, or the like to expose the solid immersion lenses 74 and thus achieve the mask 72 generally depicted in FIGS. 11 and 12. In an exemplary embodiment, a chrome opaque film 80 may be patterned by wet etching using a solution of saturated $Ce(SO_4)_2$ and concentrated $HNO_3$ in a ratio of about 9:1.

Figure 16:
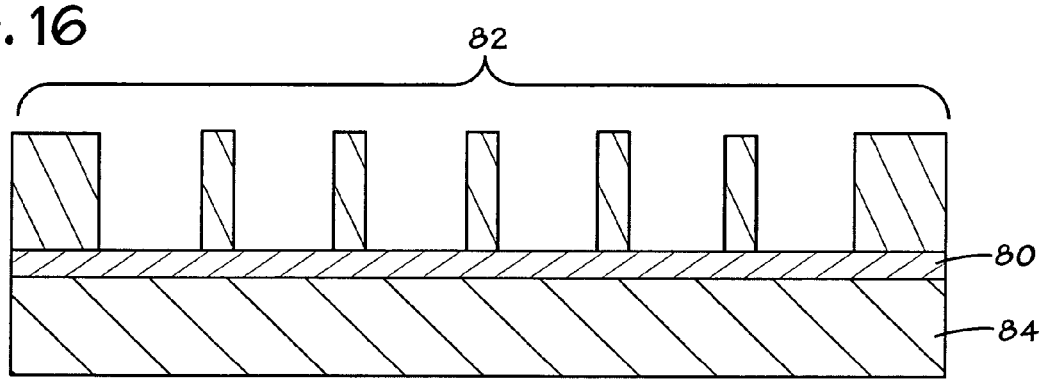
FIG. 16 is a cross-sectional view depicting the masking of an alternate embodiment of a lithography masked structure in accordance with the present invention.
Figure 17:
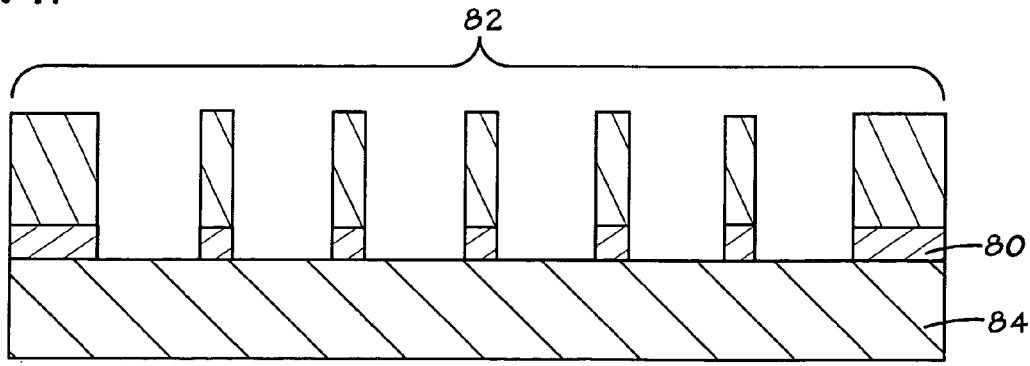
FIG. 17 is a cross-sectional view like FIG. 16 depicting material removal from an opaque film in accordance with the present invention.

The fabrication method depicted in FIGS. 13, 14 and 15 and described above is a subtractive process in that solid immersion lenses 74 depicted in those figures are fabricated by removing material from an underlying substrate or plate 78. In an alternate exemplary embodiment, an additive process may be used to fabricate a mask that incorporates one or more solid immersion lenses. Attention is now turned to FIGS. 16, 17, 18 and 19. As shown in FIG. 16, a substrate or plate 84 is coated with an opaque film 80 as generally described elsewhere herein. The plate 84 may be fabricated from the same materials used to fabricate the plate 78 depicted in the other figures and described elsewhere herein. At this point, an appropriate mask 82 is patterned on the opaque film 80 with a pattern that will correspond generally to the layout of the later-formed solid immersion lenses. The mask 82 will serve the dual functions of providing an etch mask: (1) for etch removal of various portions of the opaque film 80; and (2) for a subsequent material deposition step. As shown in FIG. 17, unmasked portions of the opaque film 80 are removed by etching, laser oblation, ion beam milling or the like.

Figure 18:
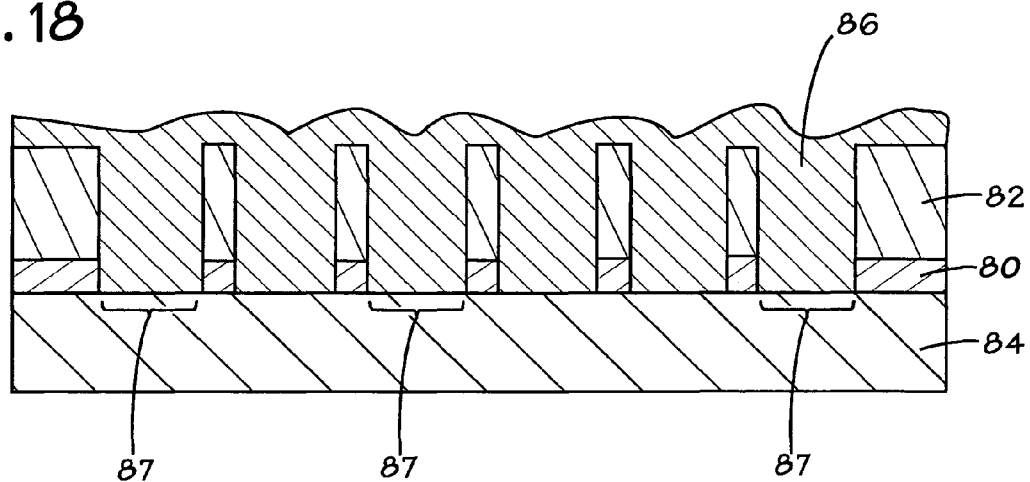
FIG. 18 is a cross-sectional view like FIG. 17 depicting formation of a bulk film-on-the-plate in accordance with the present invention.
Figure 19:
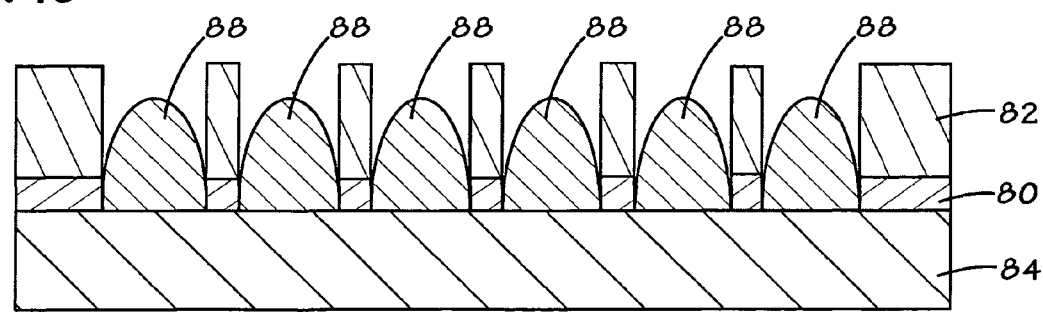
FIG. 19 is a cross-sectional view like FIG. 18 depicting formation of one or more solid immersion lenses from the bulk film in accordance with the present invention.

Referring now to FIG. 18, a film 86 is deposited over the exposed areas 87 of the underlying plate 84. Through subsequent processing, the film 86 will be patterned into one or more solid immersion lenses positioned on the underlying plate 84. Accordingly, the film 86 is advantageously fabricated from the same types of materials used to fabricate the underlying plate 84. Of course, it is desirable for the refractive index of the material selected for the film 86 to closely match that of not only the underlying plate 84 but also any resist layer to be patterned with the aid of the mask 72. Exemplary materials include, for example, spin-on-glass, various polymeric materials, plasma enhanced chemical vapor deposited oxide, or the like. Following deposition, and as shown in FIG. 19, one or more solid immersion lenses 88 are formed by performing a material removal process on the film 86. This may be accomplished by etching, laser oblation, ion beam milling or the like. The mask 82, which previously served as an etch mask for the etching of the opaque film 80 also serves as an appropriate mask for the patterning of the solid immersion lenses 88. Following the patterning of the solid immersion lenses 88, the mask 82 may be removed by well-known ashing, solvent stripping, combinations of these or the like.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
forming a resist film comprising a polymeric material containing a photoactive compound; and
forming an array of solid immersion lenses on the resist film, so that there is a light transmissive pathway from the solid immersion lenses of the array to the resist film, wherein the array of solid immersion lenses comprises the polymeric material but not containing a photoactive compound.

2. The method of claim 1, wherein the solid immersion lenses are formed as spherical structures.

3. The method of claim 1, wherein the array of solid immersion lenses comprises a substrate upon which the solid immersion lenses are positioned.

4. The method of claim 1, wherein the forming of the array of solid immersion lenses comprises forming a substrate and forming the array of solid immersion lenses from the substrate.

5. The method of claim 4, wherein the array of solid immersion lenses is formed by embossing.

6. The method of claim 4, wherein the array of solid immersion lenses is formed by milling.

7. The method of claim 1, comprising forming an anti-reflective coating on the array of solid immersion lenses.

8. The method of claim 1, wherein the array of solid immersion lenses comprises an array including a first pitch along a first axis between adjacent solid immersion lenses and a second pitch along a second axis between adjacent solid immersion lenses.

9. The method of claim 8, wherein the first and second pitches are equal.

10. The method of claim 8, wherein the first and second pitches are not equal.

11. The method of claim 1, comprising forming the resist film on a circuit device.

12. The method of claim 1, comprising forming the resist film on an integrated circuit.

13. A method of manufacturing, comprising:
forming a resist film; and
forming an array of solid immersion lenses on the resist film, so that there is a light transmissive pathway from the solid immersion lenses of the array to the resist film; and
transmitting radiation through the array of solid immersion lenses to expose a plurality of regions in the resist film.

14. The method of claim 13, wherein the resist film comprises a polymeric material containing a photoactive compound and the array of solid immersion lenses comprises the polymeric material not containing a photoactive compound.

15. The method of claim 13, wherein the forming of the array of solid immersion lenses comprises forming a substrate and forming the array of solid immersion lenses from the substrate.

16. The method of claim 13, comprising developing the resist film.

17. The method of claim 13, comprising repeatedly exposing selected portions of the resist film.

18. The method of claim 13, comprising exposing additional selected portions of the resist film with radiation transmitted through a mask.

* * * * *